(12) United States Patent
Son

(10) Patent No.: US 8,952,407 B2
(45) Date of Patent: Feb. 10, 2015

(54) LIGHTING DEVICE

(75) Inventor: Won Jin Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 134 days.

(21) Appl. No.: 13/599,321

(22) Filed: Aug. 30, 2012

(65) Prior Publication Data

US 2013/0049052 A1 Feb. 28, 2013

(30) Foreign Application Priority Data

Aug. 30, 2011 (KR) ........................ 10-2011-0086885

(51) Int. Cl.
*H01L 33/50* (2010.01)
*H01L 25/075* (2006.01)

(52) U.S. Cl.
CPC ............ *H01L 33/50* (2013.01); *H01L 25/0753* (2013.01)
USPC .................. 257/98; 257/89; 257/99; 257/676; 257/E23.141; 257/E33.059; 257/E33.056; 257/E33.066; 257/E33.075

(58) Field of Classification Search
CPC ... H01L 25/0753; H01L 33/62; H01L 33/483; H01L 33/504; H01L 2224/48091; H01L 2224/8227
USPC .............. 257/89, 99, 676, E23.141, E33.059, 257/E33.056, E33.066, E33.075
See application file for complete search history.

(56) References Cited

U.S. PATENT DOCUMENTS

| 8,089,079 | B2* | 1/2012 | Lee ................................. 257/89 |
| 8,297,793 | B2* | 10/2012 | Kim ......................... 362/249.06 |
| 8,348,457 | B2* | 1/2013 | Kadotani et al. .............. 362/231 |
| 2010/0252842 | A1* | 10/2010 | Tsang et al. ..................... 257/89 |
| 2011/0024773 | A1* | 2/2011 | Lu et al. ........................... 257/89 |
| 2013/0193465 | A1* | 8/2013 | Xu et al. .......................... 257/98 |

FOREIGN PATENT DOCUMENTS

| JP | 2006-310613 A | 11/2006 |
| KR | 10-2009-0002284 A | 1/2009 |
| KR | 10-2010-0042126 A | 4/2010 |

OTHER PUBLICATIONS

International Search Report dated Feb. 5, 2013 issued in Application No. PCT/KR2012/006731.

* cited by examiner

*Primary Examiner* — Matthew W Such
*Assistant Examiner* — David Spalla
(74) *Attorney, Agent, or Firm* — KED & Associates LLP

(57) ABSTRACT

A light emitting device package may be provided that includes: a package body which includes a first cavity and a second cavity which are formed to be depressed in at least a portion of the package body; a first light emitting device and a second light emitting device, each of which is disposed in the first cavity and the second cavity respectively; and a first fluorescent substance and a second fluorescent substance, each of which is filled in the first cavity and the second cavity respectively.

16 Claims, 5 Drawing Sheets

LIGHTING DEVICE

CROSS-REFERENCE TO RELATED APPLICATION

The present application claims priority under 35 U.S.C. §119(e) of Korean Patent Application No. 10-2011-0086885 filed Aug. 30, 2011 the subject matters of which are incorporated herein by reference.

BACKGROUND

1. Field

This embodiment relates to a light emitting device package capable of controlling a color temperature.

2. Background

In general, an electric bulb or a fluorescent lamp is commonly used as an indoor or outdoor lighting lamp. However, the electric bulb or the fluorescent lamp has a short life span, so that it should be frequently changed. Moreover, a conventional fluorescent lamp is degraded due to elapse of time for its use. As a result, it is often that its illuminance is gradually decreased.

In order to overcome such problems, a lighting apparatus is now being developed by using a light emitting device (hereinafter, referred to as LED). The LED is easy to control and has a rapid response speed, high electro-optic conversion efficiency, a long life span, low power consumption and high luminance. The LED is also used to create emotional lighting.

Recently, there is a requirement for emotional lighting. Therefore, technologies for effectively controlling a color temperature of the light emitting device are being developed.

However, according to a general method for controlling a color temperature, at least two light emitting device package are required.

SUMMARY

One embodiment is a lighting module. The lighting module includes: a package body which includes a first cavity which is formed to be depressed in at least a portion of the package body and a second cavity which is formed to be depressed in at least a portion of the bottom surface of the first cavity; a first light emitting device and a second light emitting device, each of which is disposed in the first cavity and the second cavity respectively; and a first fluorescent substance and a second fluorescent substance, each of which is filled in the first cavity and the second cavity respectively.

Another embodiment is a lighting module. The lighting module includes: a first fluorescent substance which receives an output of a first light emitting device and emits light; a second fluorescent substance which receives an output of a second light emitting device and emits light; and a package body which receives the first fluorescent substance and the second first fluorescent substance such that the first fluorescent substance is disposed on the second fluorescent substance.

BRIEF DESCRIPTION OF THE DRAWINGS

Arrangements and embodiments may be described in detail with reference to the following drawings in which like reference numerals refer to like elements and wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

Figure 1:
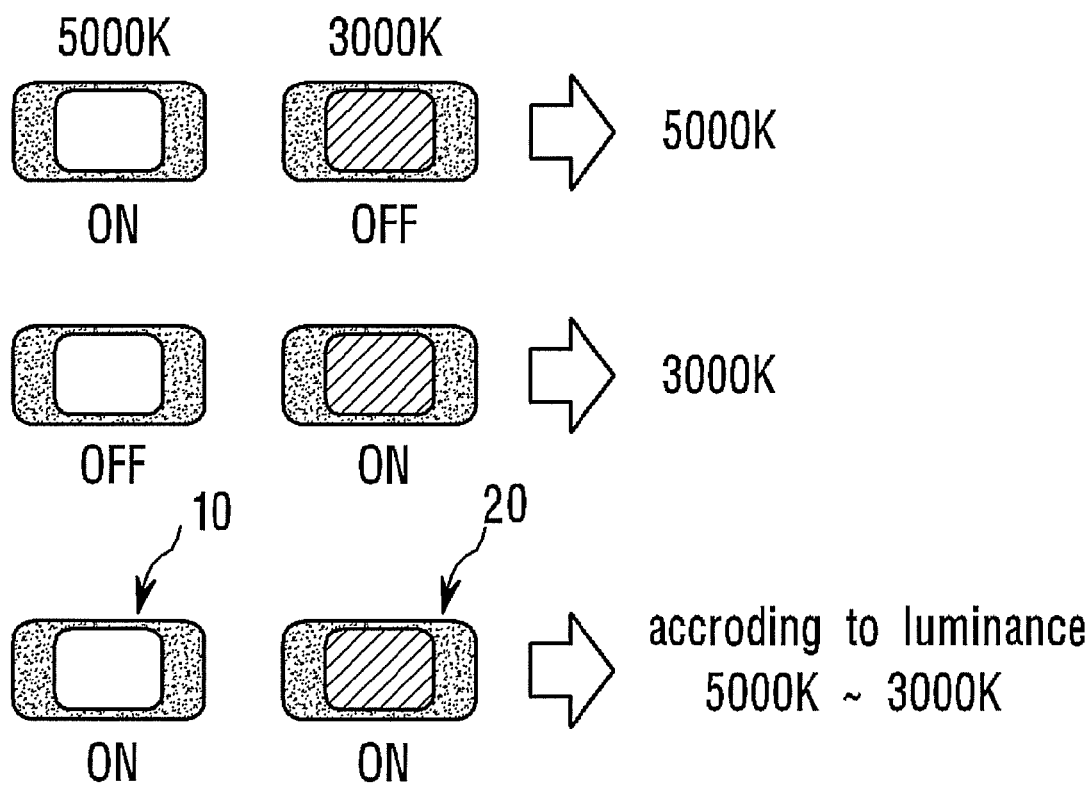
FIG. 1 is a view for describing a method for controlling a color temperature for a light emitting device.

FIG. 1 is a view for describing a method for controlling a color temperature for a light emitting device.

Referring to FIG. 1, a plurality of light emitting device packages 10 and 20 may be used to control a color temperature.

For example, when it is assumed that a first light emitting device package 10 represents a color temperature of 5,000 K and a second light emitting device package 20 represents a color temperature of 3,000 K, if only the first light emitting device package 10 becomes in an ON-state, light having a color temperature of 5,000 K is emitted, and if only the second light emitting device package 20 becomes in an ON-state, light having a color temperature of 3,000 K is emitted. Also, if both of the first and the second light emitting device packages 10 and 20 become in an ON-state, it is possible to emit light having a color temperature between 3,000 K and 5,000 K by controlling the luminance ratio thereof.

Figure 2:
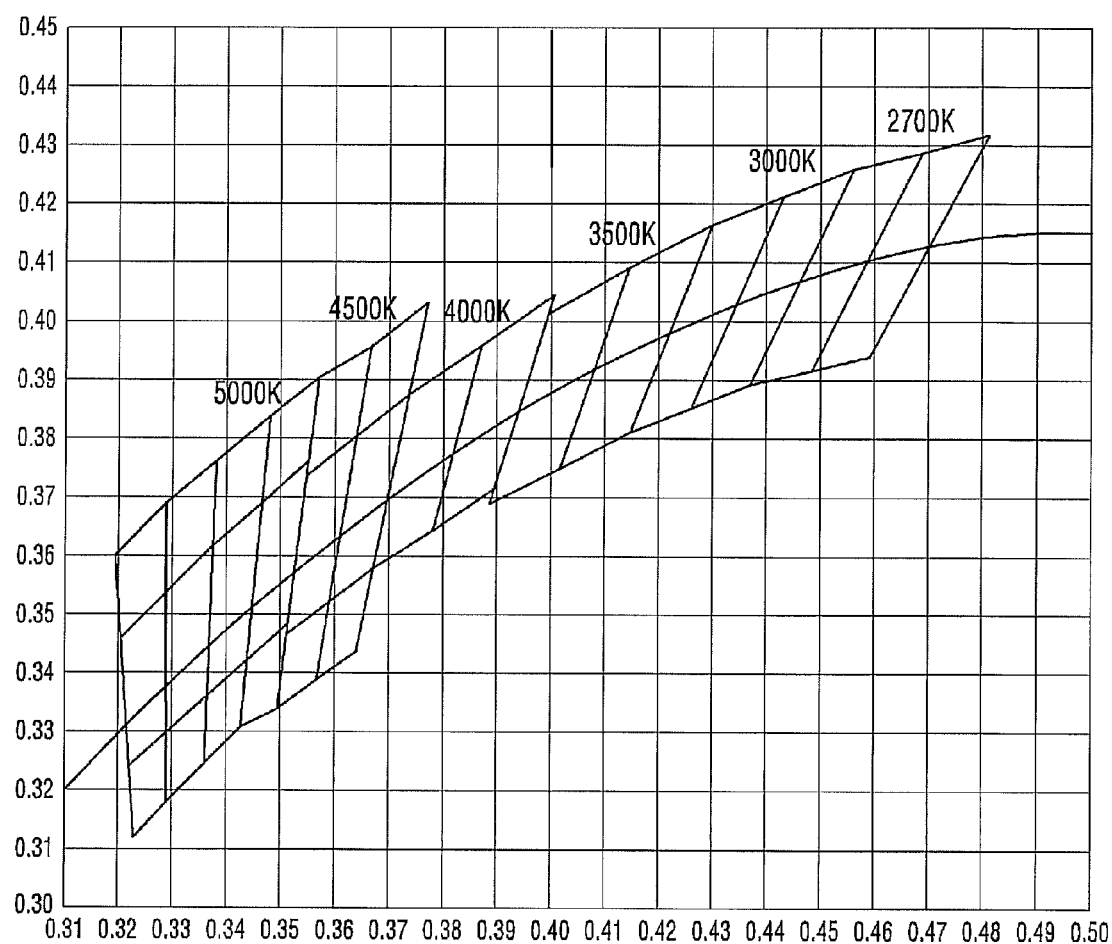
FIG. 2 is a view showing a color temperature control range of the light emitting device.

FIG. 2 is a view showing the range of light which is emitted by the above-described method.

Figure 3:
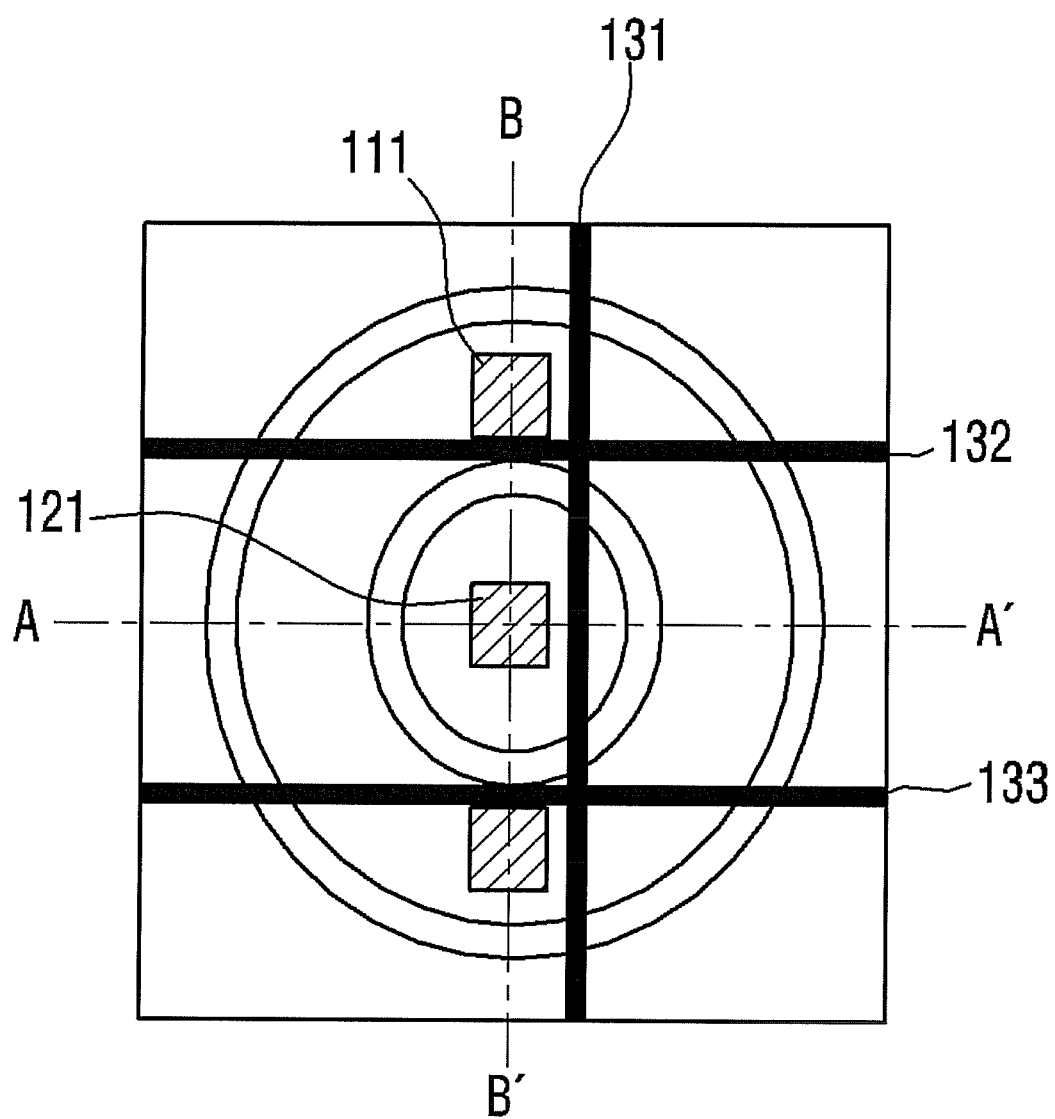
FIG. 3 is a plan view showing a configuration of an embodiment-based light emitting device package capable of controlling the color temperature.
Figure 4:
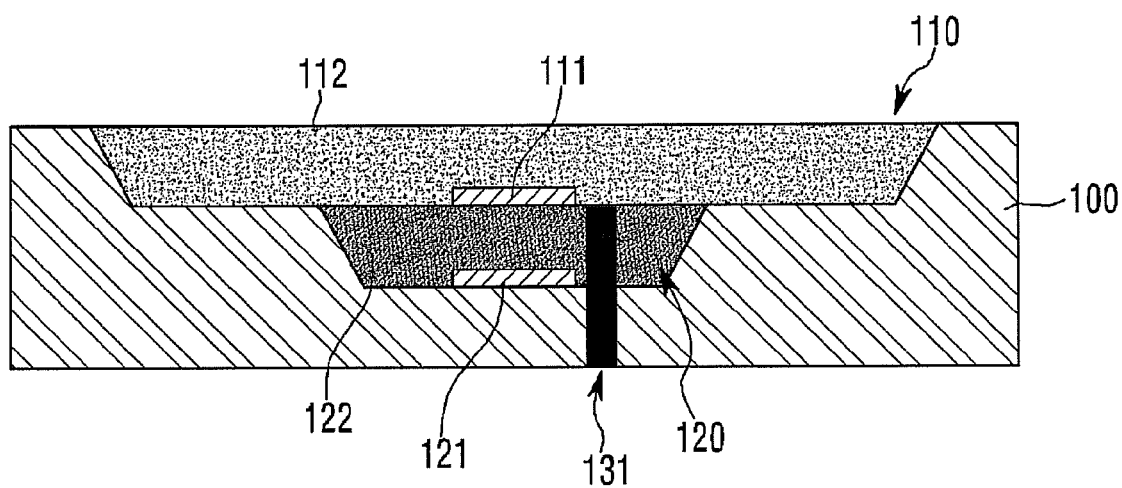
FIGS. 4 and 5 are cross sectional views showing a configuration of the embodiment-based light emitting device package capable of controlling the color temperature.
Figure 5:
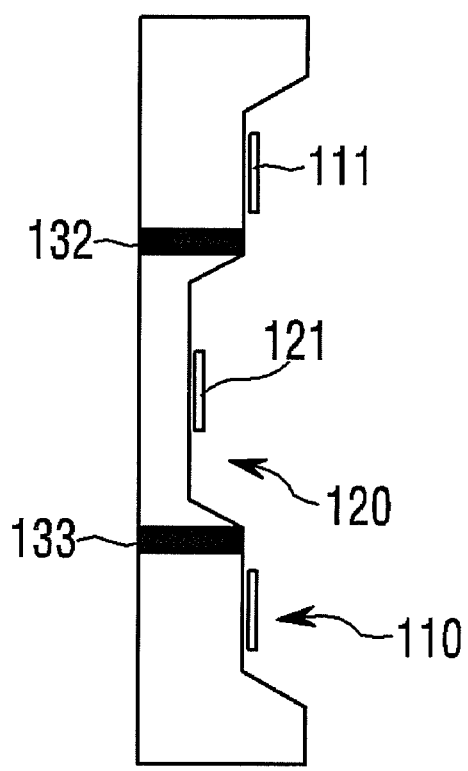

FIG. 3 is a plan view showing a configuration of an embodiment-based light emitting device package capable of controlling the color temperature. FIG. 4 is a cross sectional view of the light emitting device package of FIG. 3 taken along line A-A'. FIG. 5 is a cross sectional view of the light emitting device package of FIG. 3 taken along line B-B'.

Referring to FIGS. 3 to 5, the light emitting device package according to the embodiment includes a first cavity 110, a second cavity 120, light emitting devices 111 and 121, each of which is disposed in the cavities 110 and 120 respectively.

The first and the second cavities 110 and 120 are formed by depressing at least a portion of a package body 100. The first cavity 110 may be formed in at least a portion of the package body 100, and the second cavity 120 may be formed in another portion of the package body 100 independently of the first cavity 110. It is recommended that the first cavity 110 is formed by depressing the top surface of the package body 100, and then the second cavity 120 is formed by depressing at least a portion of the bottom surface of the first cavity 110.

Referring to FIGS. 3 to 5, the first cavity 110 is formed by forming a first depression having a first radius based on a particular point of the package body 100 (for example, a central point). The second cavity 120 is formed by forming a second depression having a second radius less than the first radius on the basis of a particular point of the first depression (for example, a central point). However, there is no limit to this. In other words, the cavities 110 and 120 are not necessarily formed in the form of a circle as viewed from the top of the package body 100, and it is enough as long as the second cavity 120 is formed at at least one point within the first cavity 110.

The at least one light emitting device 111 is disposed on the bottom surface of the first cavity 110. The at least one light emitting device 121 is disposed on the bottom surface of the second cavity 120. Though the drawings show that the one light emitting device 111 is disposed at the center of the bottom surface of the first cavity 110 and the two light emitting devices 121 are disposed symmetrically on the bottom surface of the second cavity 120 on the basis of the center of the bottom surface of the first cavity 110, there is no limit to this. That is, the number of the light emitting devices 111 and 121 which are disposed in the first and the second cavities 110 and 120 may be different from that of the above-mentioned case shown in the drawings. Also, it can be considered that a plurality of the light emitting devices 111 and 121 are not necessarily symmetrically disposed. It is possible that a height from the bottom surface of the first cavity 110 to the surface of the package body 100 (depth of the first cavity 110) is different from a height from the bottom surface of the first cavity 110 to the bottom surface of the second cavity 120 (depth of the second cavity 120).

While the light emitting devices 111 and 121 can be preferably implemented by a light emitting diode (LED), any device capable of emitting light can be used as the light emitting devices 111 and 121 according to the embodiment. At least one of the light emitting device 111 disposed in the first cavity 110 and the light emitting device 121 disposed in the second cavity 120 may be a light emitting device emitting blue light. However, there is no limit to this.

Fluorescent substances 112 and 122 are filled in the first cavity 110 and the second cavity 120 respectively. Specifically, the fluorescent substance 122 is filled in the second cavity 120 up to the height from the bottom surface of the second cavity 120 to the bottom surface of the first cavity 110. The fluorescent substance 112 is filled in the first cavity 110 from the bottom surface thereof to the top surface of the package body 100 in such a manner as to cover the entire second cavity 120. Any one of the fluorescent substance 112 filled in the first cavity 110 and the fluorescent substance 122 filled in the second cavity 120 may be a red fluorescent substance, and the other one may be either a yellow fluorescent substance or a green fluorescent substance. However, there is no limit to this. As the mutually different fluorescent substances or the fluorescent substances emitting mutually different color light are filled in the first and the second cavities 110 and 120, the color temperature or color of the light emitted from the entire light emitting device package can be changed. For example, a light output of any one of the light emitting device 111 of the first cavity 110 and the light emitting device 121 of the second cavity 120 is adjusted, so that the color temperature can be controlled.

Insulators 131, 132 and 133 are further formed in the package body 100 in order to insulate each of the light emitting devices 111 and 121. The insulators 131, 132 and 133 may be formed to insulate the anode from the cathode of one of the light emitting devices 111 and 121, or may be formed to insulate the light emitting devices 111 and 121. For example, the first insulator 131 shown in FIGS. 3 and 4 is formed to insulate an anode connection line from a cathode connection line of the light emitting device 121 disposed in the second cavity 120. Meanwhile, the second insulator 132 and the third insulator 133 shown in FIGS. 3 and 5 may be foamed to insulate the light emitting device 111 disposed in the first cavity 110 from another light emitting device 111.

Since each of the insulators 131, 132 and 133 is formed to vertically penetrate the package body 100, complete electrical insulation can be obtained.

According to the embodiment, a plurality of the cavities 110 and 120 are formed, the light emitting devices 111 and 121, each of which is disposed in the cavities 110 and 120 respectively, and the cavities 110 and 120 are filled with mutually different fluorescent substances. As a result, the outputs of the light emitting devices 111 and 121, each of which is disposed in the cavities 110 and 120 respectively, are controlled even only by one package, so that it is possible to control the color or color temperature of the light emitted from the light emitting device package.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a package body that includes a first cavity which is formed to be depressed in at least a portion of the package body and a second cavity which is formed to be depressed in at least a portion of a bottom surface of the first cavity;
   a first light emitting device and a second light emitting device, each of which is disposed in the first cavity and the second cavity respectively; and
   a first fluorescent substance and a second fluorescent substance, each of which is filled in the first cavity and the second cavity respectively,
   wherein the first fluorescent substance and the second fluorescent substance are different from each other.

2. The light emitting device package of claim 1, wherein the first cavity has a first radius, and wherein the second cavity has a second radius less than the first radius based on a predetermined point of the first cavity.

3. The light emitting device package of claim 1, wherein the first light emitting device and the second light emitting device are disposed on the bottom surfaces of the first cavity and the second cavity respectively, wherein the second fluorescent substance is filled up to a height of the bottom surface of the first cavity in such a manner as to cover the second light emitting device, and wherein the first fluorescent substance is filled up to a height from the bottom surface of the first cavity to the top surface of the package body in such a manner as to cover the first light emitting device.

4. The light emitting device package of claim 1, wherein one of the first fluorescent substance or the second fluorescent substance emits red light, and wherein the other one of the first fluorescent substance or the second fluorescent substance emits yellow light or green light.

5. The light emitting device package of claim 1, wherein at least one of the first light emitting device and the second light emitting device emits blue light.

6. The light emitting device package of claim 3, wherein the first light emitting device and the second light emitting device comprise at least one light emitting device respectively.

7. The light emitting device package of claim 1, wherein a depth of the first cavity is different from a depth of the second cavity.

8. The light emitting device package of claim 1, further comprising at least one insulator that insulates anode connection from cathode connection of the first light emitting device and the second light emitting device, insulates each of the first light emitting device and the second light emitting device, and is formed to vertically penetrate at least a portion of the package body.

9. A light emitting device package comprising:
a first fluorescent substance that receives an output of a first light emitting device and emits light;
a second fluorescent substance that receives an output of a second light emitting device and emits light; and
a package body that the first fluorescent substance and the second first fluorescent substance such that the first fluorescent substance is disposed on the second fluorescent substance,
wherein the first fluorescent substance and the second fluorescent substance are different from each other.

10. The light emitting device package of claim 9, wherein one of the first fluorescent substance or the second fluorescent substance emits red light, and wherein the other one of the first fluorescent substance or the second fluorescent substance emits yellow light or green light.

11. The light emitting device package of claim 9, wherein at least one of the first light emitting device and the second light emitting device emits blue light.

12. The light emitting device package of claim 9, wherein an intensity of the received output of the first light emitting device is different from an intensity of the received output of the second light emitting device.

13. The light emitting device package of claim 9, wherein an intensity of the received output of the first light emitting device and an intensity of the received output of the second light emitting device are adjusted so that a color temperature or color of the light of the light emitting device package is controlled.

14. The light emitting device package of claim 9, wherein a diameter of an area receiving the first fluorescent substance is larger than a diameter of an area receiving the second fluorescent substance.

15. The light emitting device package of claim 9, wherein the first light emitting device and the second light emitting device comprise at least one light emitting device respectively.

16. The light emitting device package of claim 9, wherein a height of an area receiving the first fluorescent substance is different from a height of an area receiving the second fluorescent substance.

* * * * *